(12) United States Patent
Hollmer

(10) Patent No.: US 6,970,386 B2
(45) Date of Patent: Nov. 29, 2005

(54) METHOD AND APPARATUS FOR DETECTING EXPOSURE OF A SEMICONDUCTOR CIRCUIT TO ULTRA-VIOLET LIGHT

(75) Inventor: Shane C. Hollmer, San Jose, CA (US)

(73) Assignee: Emosyn America, Inc., Sunnyvale, CA (US)

( * ) Notice: Subject to any disclaimer, the term of this patent is extended or adjusted under 35 U.S.C. 154(b) by 225 days.

(21) Appl. No.: 10/378,414

(22) Filed: Mar. 3, 2003

(65) Prior Publication Data

US 2004/0174749 A1 Sep. 9, 2004

(51) Int. Cl.$^7$ .............................................. G11C 16/04
(52) U.S. Cl. ............................ 365/185.32; 365/185.04
(58) Field of Search ........................ 365/185.32, 185.04, 365/185.33

(56) References Cited

U.S. PATENT DOCUMENTS 5,598,004 A * 1/1997 Powell et al. .......... 250/370.09
2002/0036879 A1 * 3/2002 Vacherand et al. ........ 361/93.1

OTHER PUBLICATIONS

PCT Search Report corresponding to the related PCT Patent Application No. US04/06202 mailed on Jul. 21, 2005.

PCT Written Opinion corresponding to the related PCT Patent Application No. US04/06202 mailed on Jul. 21, 2005.

* cited by examiner

Primary Examiner—Hoai Ho
(74) Attorney, Agent, or Firm—DLA Piper Rudnick Gray Cary US LLP

(57) ABSTRACT

A method and apparatus are disclosed for detecting if a semiconductor circuit has been exposed to ultra-violet light. An ultra-violet light detection circuit detects exposure to ultra-violet light and will automatically activate a security violation signal. The security violation signal may optionally initiate a routine to clear sensitive data from memory or prevent the semiconductor circuit from further operation. The ultra-violet light detection circuit detects whether a semiconductor circuit has been exposed to ultra-violet light, for example, by employing a dedicated mini-array of non-volatile memory cells. At least two active bit lines, blprg and bler, are employed corresponding to program and erase, respectively. One of the bit lines is only programmable and the other bit line is only eraseable. Generally, all of the bits in the dedicated non-volatile memory array are initially in approximately the same state, which could be erased, programmed or somewhere in between. An offset current is added to one bit line and a change in the resulting current difference is used to detect an exposure to ultra-violet light.

18 Claims, 7 Drawing Sheets

METHOD AND APPARATUS FOR DETECTING EXPOSURE OF A SEMICONDUCTOR CIRCUIT TO ULTRA-VIOLET LIGHT

FIELD OF THE INVENTION

The present invention relates generally to a method and apparatus for protecting a semiconductor circuit, such as a secure integrated circuit, from tampering and more particularly, to a method and apparatus for detecting when a semiconductor circuit has been exposed to ultra-violet light.

BACKGROUND OF THE INVENTION

Semiconductor circuits, especially of the System on a Chip type, are often the target of an attack. Attackers may attempt to alter the program code or data stored in the memory of the semiconductor circuit in order to break into the semiconductor circuit or to identify what is stored on the semiconductor circuit. One common method of attack is to shine an ultra-violet (UV) light on the memory cells thereby causing the memory cells to lose the charge stored on their floating gates and altering the functionality of the semiconductor circuit. UV light renders the oxide portion of the transistors comprising each memory cell partially conductive and the charge trapped on the floating gate of the memory cell can leak away. Such security impairments are of particular concern when the semiconductor circuits are used for secure applications, such as banking or the recording of personal or proprietary information.

Thus, a need exists for a method and apparatus for detecting if a semiconductor circuit has been exposed to ultra-violet light.

SUMMARY OF THE INVENTION

Generally, a method and apparatus are disclosed for detecting if a semiconductor circuit has been exposed to ultra-violet light. When a semiconductor circuit is exposed to ultra-violet light, an ultra-violet light detection circuit will detect the exposure and will automatically activate a security violation signal indicating that the security of the semiconductor circuit may have been impaired. The present invention can detect exposure to ultra-violet light whether or not power is applied to the semiconductor circuit at the time of the exposure. If a semiconductor circuit is exposed to ultra-violet light when power is not applied, the ultra-violet light detection circuit will immediately detect the exposure the next time power is applied, before any other processing takes place. The present invention thus allows special processing to be performed if a semiconductor circuit has been tampered with, such as clearing sensitive data from memory or preventing the semiconductor circuit from further operation.

The ultra-violet light detection circuit detects whether a semiconductor circuit has been exposed to ultra-violet light, for example, by employing a dedicated mini-array of non-volatile memory cells. At least two active bit lines, blprg and bler, are employed corresponding to program and erase, respectively. The first bit line, blprg, is only programmable, and may not be erased. The second bit line, bler, is only eraseable and may not be programmed. Generally, all of the bits in the dedicated non-volatile memory array are initially in approximately the same state, which could be erased, programmed or somewhere in between.

An offset current is added to one of the bit lines, such that when the offset bit line is compared to the bit line that has not been offset, a current difference can be detected. A change in the current difference created by the offset current can be used to indicate, for example, when the semiconductor circuit has been exposed to UV light. Thus, when all of the bits in the dedicated non-volatile memory array are initially in approximately the same state, this is deemed, for example, to be an exposed state. The bits on the offset bit line can be subsequently programmed and the bits on the bit line that has not been offset can be erased, for example, during an initialization routine performed most likely during manufacturing. Following such an initialization, the relative currents drawn by each memory cell in the dedicated mini-array can be defined to be an unexposed state. If the semiconductor circuit is thereafter exposed to UV light, the memory cells will be neutralized, and the resulting change in current difference can be detected to indicate that the semiconductor circuit has been exposed to ultra-violet light. Generally, the current difference between erased bit(s) and programmed bit(s) should be more than the offset current applied in order to be able to properly initialize the circuit. The amount above the offset current directly affects the tolerance to UV exposure and is technology dependent.

A more complete understanding of the present invention, as well as further features and advantages of the present invention, will be obtained by reference to the following detailed description and drawings.

DETAILED DESCRIPTION OF PREFERRED EMBODIMENTS

Figure 1:
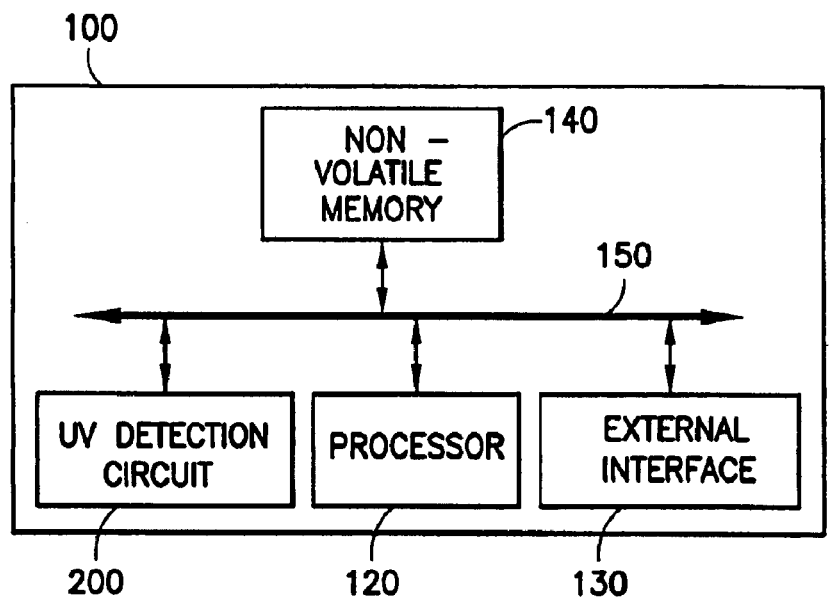
FIG. 1 is a schematic block diagram of a semiconductor circuit incorporating features of the present invention.

FIG. 1 is a schematic block diagram of a semiconductor circuit 100 incorporating features of the present invention. As shown in FIG. 1, the semiconductor circuit 100 includes a processor 120, an external interface 130 and a non-volatile memory 140, each communicating over a bus 150. According to one aspect of the present invention, the semiconductor circuit 100 also includes an ultra-violet light detection circuit 200, discussed further below in conjunction with FIG. 2. The processor 120, external interface 130 and a non-volatile memory 140 operate in a conventional manner.

The external interface 130 may be embodied in many forms, but typically would be a recognized standard, for example, as a serial interface, parallel interface or a Universal Serial Bus (USB). The external interface 130 can optionally be connected to an external computing device (not shown) that can monitor the semiconductor circuit 100 or provide an instruction stream for execution by the processor 120, such as a stream of bytes having predefined values to indicate appropriate instructions.

According to one aspect of the invention, when the semiconductor circuit 100 is exposed to ultra-violet light, the ultra-violet light detection circuit 200 will detect the UV exposure and will automatically activate a security violation signal. If a semiconductor circuit has been exposed to ultra-violet light, the generated security violation signal may automatically trigger, for example, a routine to clear sensitive data from memory or to prevent the semiconductor circuit from further operating (or both).

Figure 3:
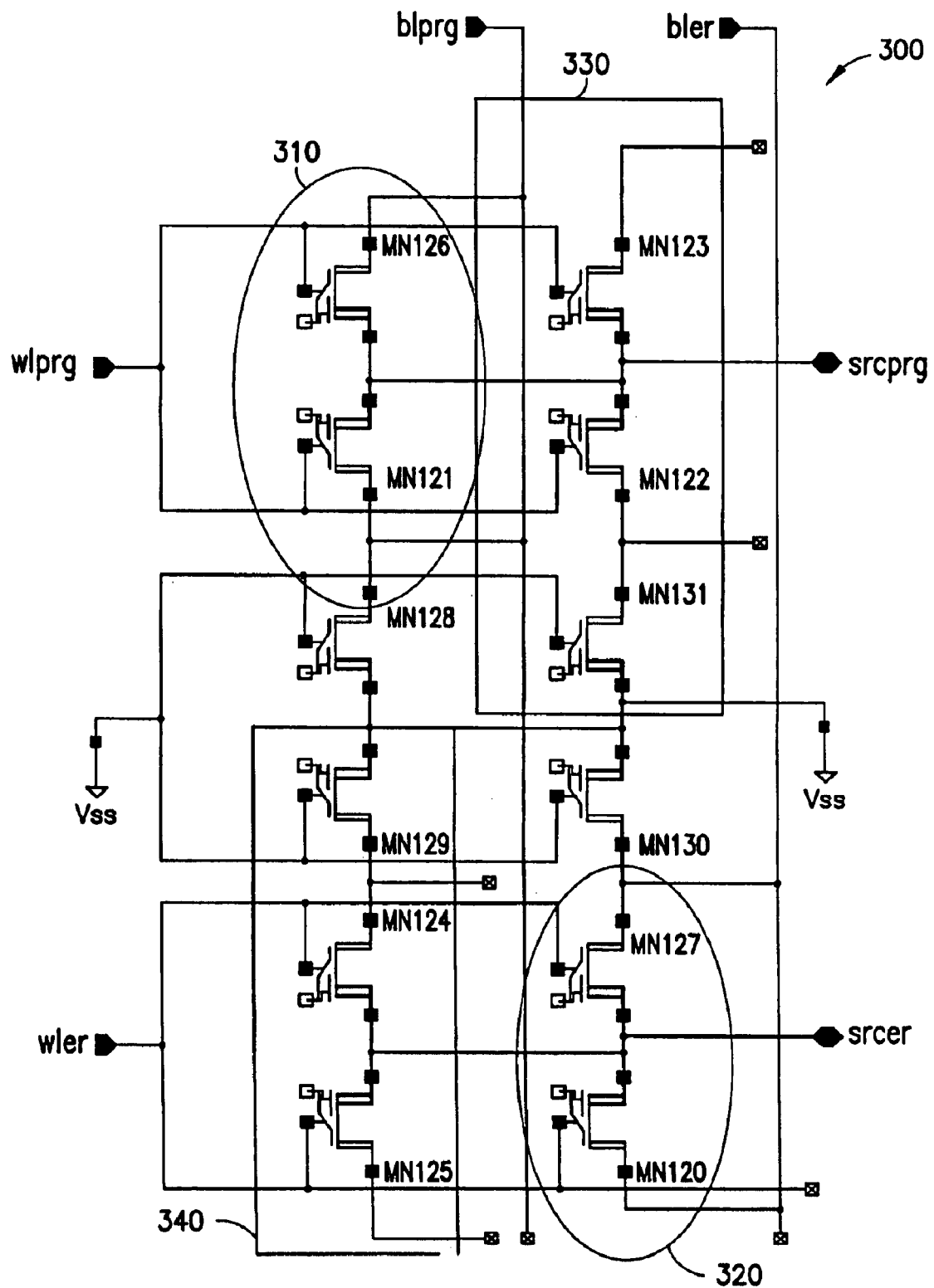
FIG. 3 is a circuit diagram of an exemplary non-volatile memory array of FIG. 2.

The ultra-violet light detection circuit 200 detects whether a semiconductor circuit has been exposed to ultra-violet light by employing a dedicated mini-array of non-volatile memory 300, shown in FIG. 3. The ultra-violet light detection circuit 200 can be left exposed without a top layer metal cover, such that the ultra-violet light detection circuit 200 is sensitive to UV exposure. It is noted that a number of ultra-violet light detection circuits 200 can be positioned on a single semiconductor circuit 100 and employing an OR function to each of the outputs of the ultra-violet light detection circuits 200, such that any one or combination that detects an exposed state will be enabled and the OR output will signal an exposed state.

UV EXPOSURE DETECTION

As previously indicated, the ultra-violet light detection circuit 200 detects when the semiconductor circuit 100 has been exposed to ultra-violet light and thereafter provides an indication of the security violation. Generally, as discussed further below, the ultra-violet light detection circuit 200 uses the state of a non-volatile memory array to detect whether the semiconductor circuit 100 has been exposed to ultra-violet light. The present invention recognizes that the particular state of a non-volatile memory cell will be unknown, i.e., whether the cell is charged or uncharged. The present invention provides a method that can determine whether a semiconductor circuit 100 has been exposed to ultra-violet light independent of whether the non-volatile memory cells are charged or uncharged.

In one exemplary embodiment, discussed further below in conjunction with FIGS. 2 and 3, the present invention detects whether a semiconductor circuit 100 has been exposed to ultra-violet light using a dedicated mini-array 300 of non-volatile memory cells. The array 300 of non-volatile memory cells includes two active bit lines, blprg and bler, corresponding to program and erase, respectively. The first bit line, blprg, is only programmable, and may not be erased. The second bit line, bler, is only eraseable and may not be programmed.

Generally, all of the bits in the non-volatile memory array 300 are initially in approximately the same state, which could be erased, programmed or somewhere in between. An offset current is added to one of the bit lines, such that when the offset bit line is compared to the bit line that has not been offset, a current difference can be detected. The current difference created by the offset current can be used to indicate, for example, when the semiconductor circuit 100 has been exposed to ultra-violet light.

Thus, when all of the bits in the dedicated non-volatile memory array 300 are initially in approximately the same state, this is deemed, for example, to be an exposed state. The bits on the offset bit line can be subsequently programmed and the bits on the bit line that has not been offset can be erased, for example, during an initialization routine. Following such an initialization, the relative currents drawn by each memory cell in the dedicated mini-array 300 can be defined to be an unexposed state. If the semiconductor circuit is thereafter exposed to UV light, the memory cells in the array 300 will be neutralized, and the resulting change in current can be detected to indicate that the semiconductor circuit 100 has been exposed to ultra-violet light. Generally, the current difference between erased bit(s) and programmed bit(s) should be more than the offset current applied in order to properly initialize the UV detector.

The offset current should be set approximately between the current level of a programmed device and an erased device. For example, if a cell in a programmed state draws 5 $\mu$A and in an erased state draws 50 $\mu$A then the offset current, for the embodiment using two cells per bit line as shown in FIG. 3, should be approximately 45 $\mu$A (100 $\mu$A from two cells minus 10 $\mu$A from two cells divided by two). In addition, depending on the technology, desired UV tolerance, and other information, the offset current can be skewed to favor either the programmed or erased state. It is noted that the erase and program operations of the non-volatile memory 300 can use the same timing and voltages as those of the regular non-volatile memory array 140.

Figure 2:
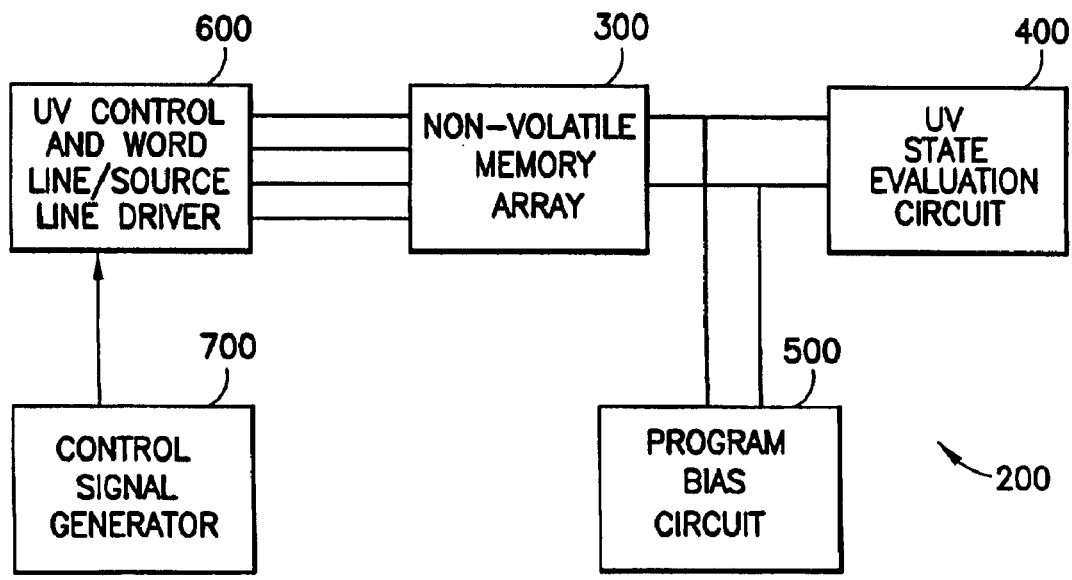
FIG. 2 is a schematic block diagram of the ultra-violet light detection circuit of FIG. 1.

FIG. 2 is a schematic block diagram of one embodiment for the ultra-violet light detection circuit 200 of FIG. 1. As shown in FIG. 2, the ultra-violet light detection circuit 200 includes the non-volatile memory array 300, discussed further below in conjunction with FIG. 3, a UV state evaluation circuit 400, discussed further below in conjunction with FIG. 4, a program bias circuit 500, discussed further below in conjunction with FIG. 5, a UV control and word line/source line driver 600, discussed further below in conjunction with FIG. 6, and a control signal generator 700, discussed further below in conjunction with FIG. 7. The ultra-violet light detection circuit 200 generates a UV exposure flag indicator that indicates whether or not the semiconductor circuit 100 has been exposed to ultra-violet light.

FIG. 3 is a circuit diagram of an exemplary non-volatile memory array 300 incorporating features of the present invention. It is noted that the symbols used are for one possible non-volatile memory technology, however, it should be clear to someone skilled in the art that virtually any non-volatile memory technology could be used. As shown in FIG. 3, the non-volatile memory array 300 includes two active bit lines, blprog and blerase. The non-volatile memory array 300 includes a number of transistors. A first pair of transistors 310 may only be programmed, and may not be erased. The second pair of transistors 320 may only be erased, and may not be programmed. The program and erase transistors 310, 320, respectively, in the non-volatile memory array 300 are configured such that the drain is accessed via the bit line inputs, blprg and bler, the gate is accessed via the word line inputs, wlprg and wler, and the source is accessed via the source line inputs, srcprg and srcer, respectively. The program transistors 310 are programmed to remove the unexposed state. Likewise, the erase transistors 320 are erased to remove the unexposed state. It is noted that two transistors 310, 320 are used in the exemplary embodiment for each of the program and erase operations, respectively, to average out the odd/even effects that can occur during manufacturing. However, individual transistors or sets of transistors can also be employed, as would be apparent to a person of ordinary skill in the art.

In operation, when the semiconductor circuit 100 is first powered up and initialized (in an unexposed state), the two program transistors 310 and the two erase transistors 320 are in approximately the same state, which could be erased, programmed or somewhere in between, and provide equal of amounts of currents during sensing. If the semiconductor circuit 100 is attacked with ultra-violet light, the cells in the non-volatile memory array 300 will begin to revert and detect as exposed or tampered. By adjusting the offset current, the level of UV exposure allowed can be adjusted.

The program transistors 310 can be programmed by applying a high voltage (e.g., 10V) to the source program line, srcprg, a select voltage (e.g., 1.5V) to the word line program, wlprg, and a small current sink (e.g., 2 µA) to the bit line program, blprg. Once programmed, the program transistors 310 will not provide current during sensing.

The erase transistors 320 can be erased by applying a high voltage (e.g., 13V) to the word line erase, wler, and applying ground to the source line erase, srcer, and to the bit line erase, bler. Once erased, the erase transistors 320 will provide a significant current, e.g., on the order of 35 µA each, during sensing.

In order to prevent edge effects, the non-volatile memory array 300 may optionally include a number of additional transistor and associated bit lines (not shown), so that the two active transistor and bit lines, BLprog and BLerase, are uniform, in a known manner. In another variation, the bit lines of the transistors 340 in the program bit line have their bit line contacts removed so that they do not influence the program transistors 310. Similarly, the bit lines of the transistors 330 in the erase bit line have their bit line contacts removed so that they do not influence the erase transistors 320.

Figure 4A:
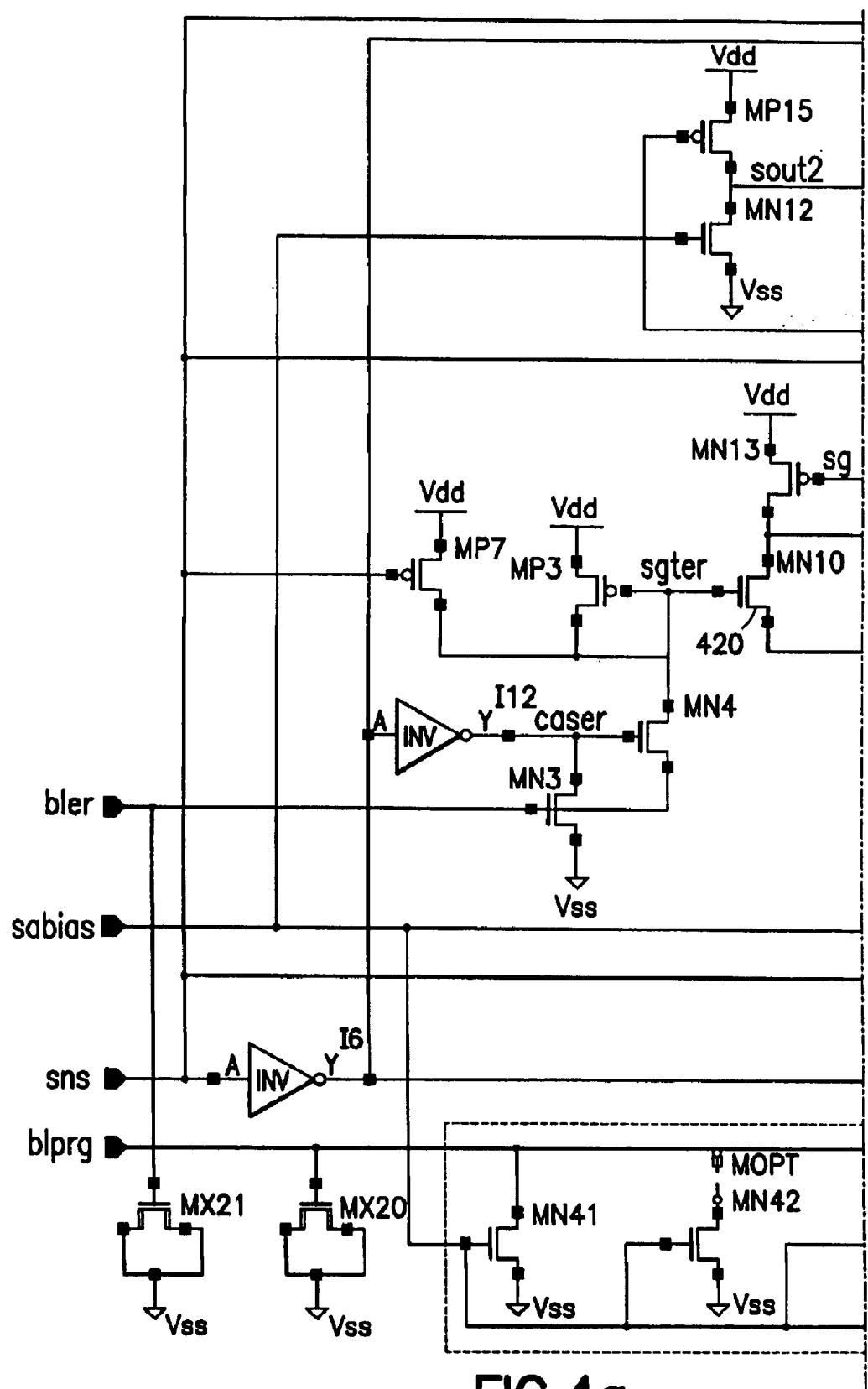
FIG. 4 is a circuit diagram of an exemplary ultra-violet light state evaluation circuit of FIG. 2.
Figures 4, 4B:
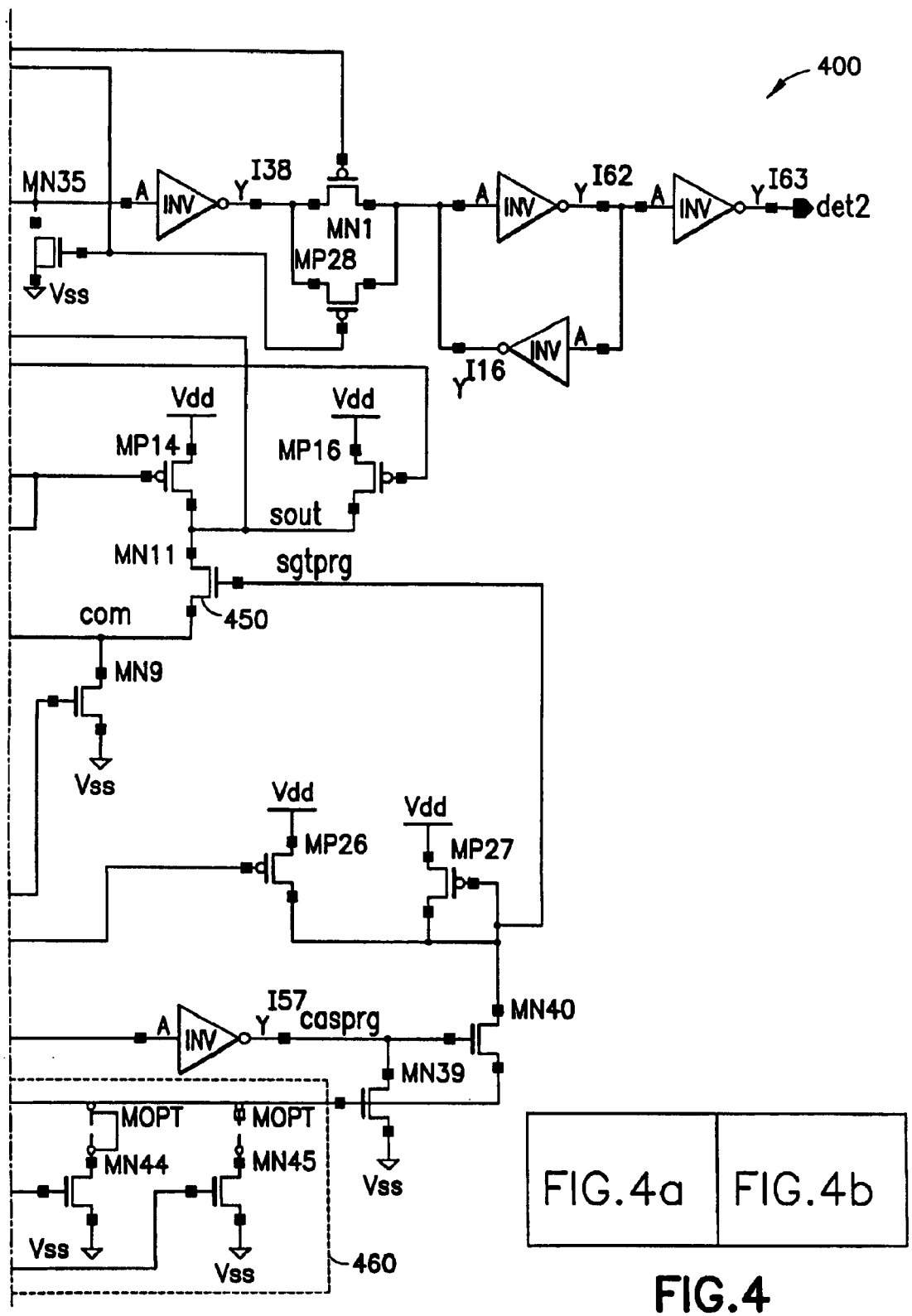

FIG. 4 is a circuit diagram of an exemplary UV state evaluation circuit 400 incorporating features of the present invention. As shown in FIG. 4, the UV state evaluation circuit 400 includes a first cascode amplifier structure 410 that feeds an input MN10 420 of a differential pair 430. A second cascode amplifier structure 440 feeds an input MN11 450 of the differential pair 430.

As previously indicated, an offset current is added to one of the bit lines, such that when the offset bit line is compared to the bit line that has not been offset, a difference can be detected. The offset current is generated by a set of transistors 460. The first cascode amplifier structure 410 converts the current on the bit line erase input, bler, to a voltage. The second cascode amplifier structure 440 converts the current on the bit line program input, blprg, plus the offset current to a voltage. In this manner, the cascode amplifier structures 410, 420, in conjunction with the differential pair 430, compare the currents on the bit line program and bit line erase inputs.

The bias input, sabias, provides an analog voltage level that biases the two stages of the UV state evaluation circuit 400. The sense input, sns, is a control signal that enables the sensing of the state of the cells inside the non-volatile memory array 300. For example, the non-volatile memory array 300 can be enabled whenever the semiconductor circuit 100 is reset or powered up.

For a more detailed discussion of a suitable technique for sensing a memory cell, see, for example, U.S. Pat. No. 6,219,291 to Sowards et al., assigned to the assignee of the present invention and incorporated by reference herein. Generally, the disclosed technique for sensing a memory cell employs a logic level detection circuit that includes a sense amplifier that senses a logic level based on a corresponding current consumption.

Figure 5:
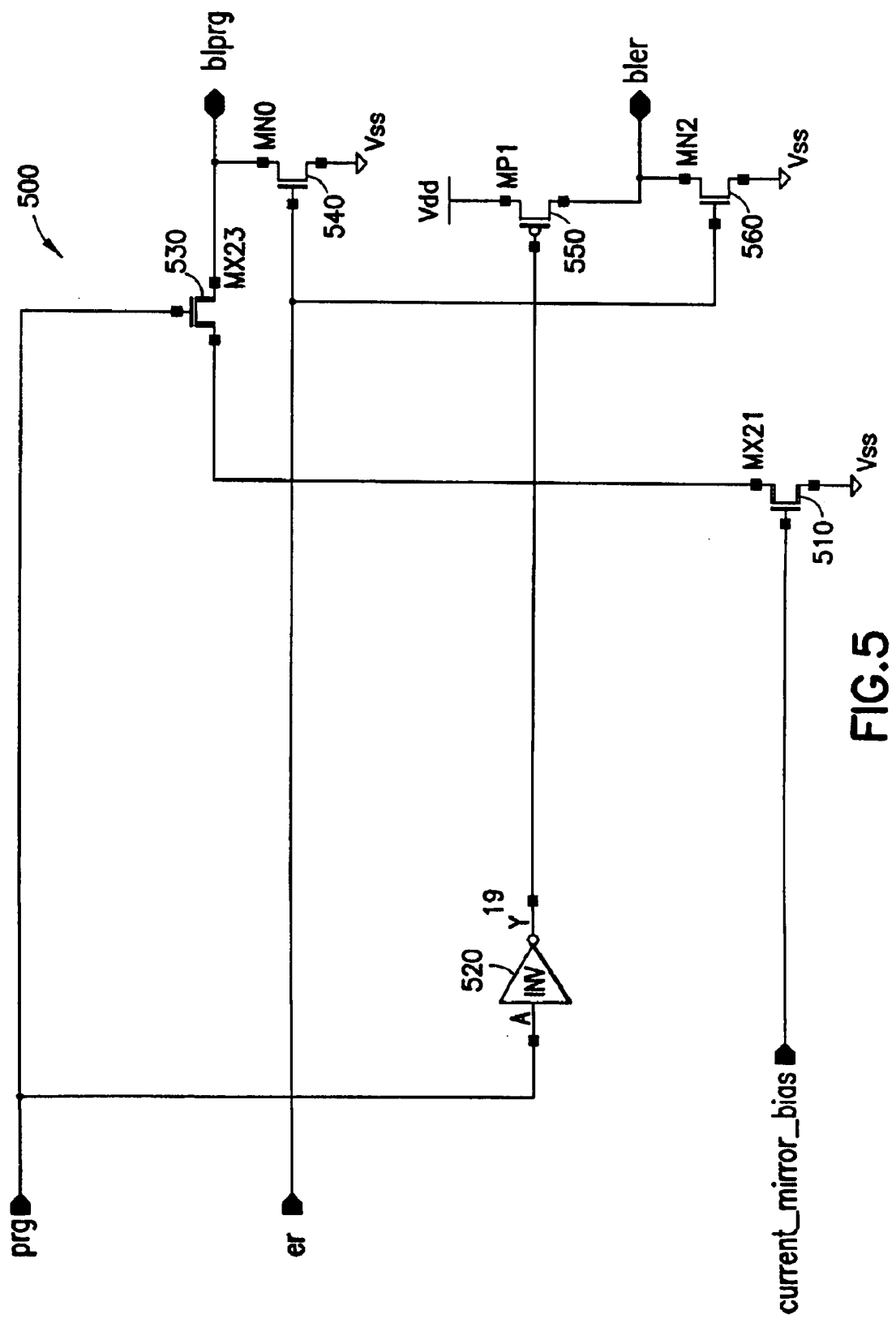
FIG. 5 is a circuit diagram of an exemplary program bias circuit of FIG. 2.

FIG. 5 is a circuit diagram of an exemplary program bias circuit 500 incorporating features of the present invention. The program bias circuit 500 provides current and voltages to the bit lines during programming. The program bias circuit 500 ensures that only transistors on the program transistor line 310 in the non-volatile memory array 300 can be programmed, and that the erase transistor line 320 in the non-volatile memory array 300 cannot be programmed.

As shown in FIG. 5, the inputs prg and er are high during the program and erase modes, respectively. If both inputs prg and er are low, the program bias circuit 500 is in a normal mode and is not generating a bias or influence on the bit line program or bit line erase lines. A current mirror 510 generates a known bias current, on the order of 2 µA in the exemplary embodiment. The bias current is passed by the transistor 530.

In the program mode, i.e., when the prg line is high, the transistor 550 is enabled and pulls the bit line erase output (bler) up to $V_{dd}$. Likewise, in the erase mode, i.e., when the er line is high, the transistor 540 is enabled and pulls the bit line program output (blprg) up to $V_{dd}$.

Figure 6:
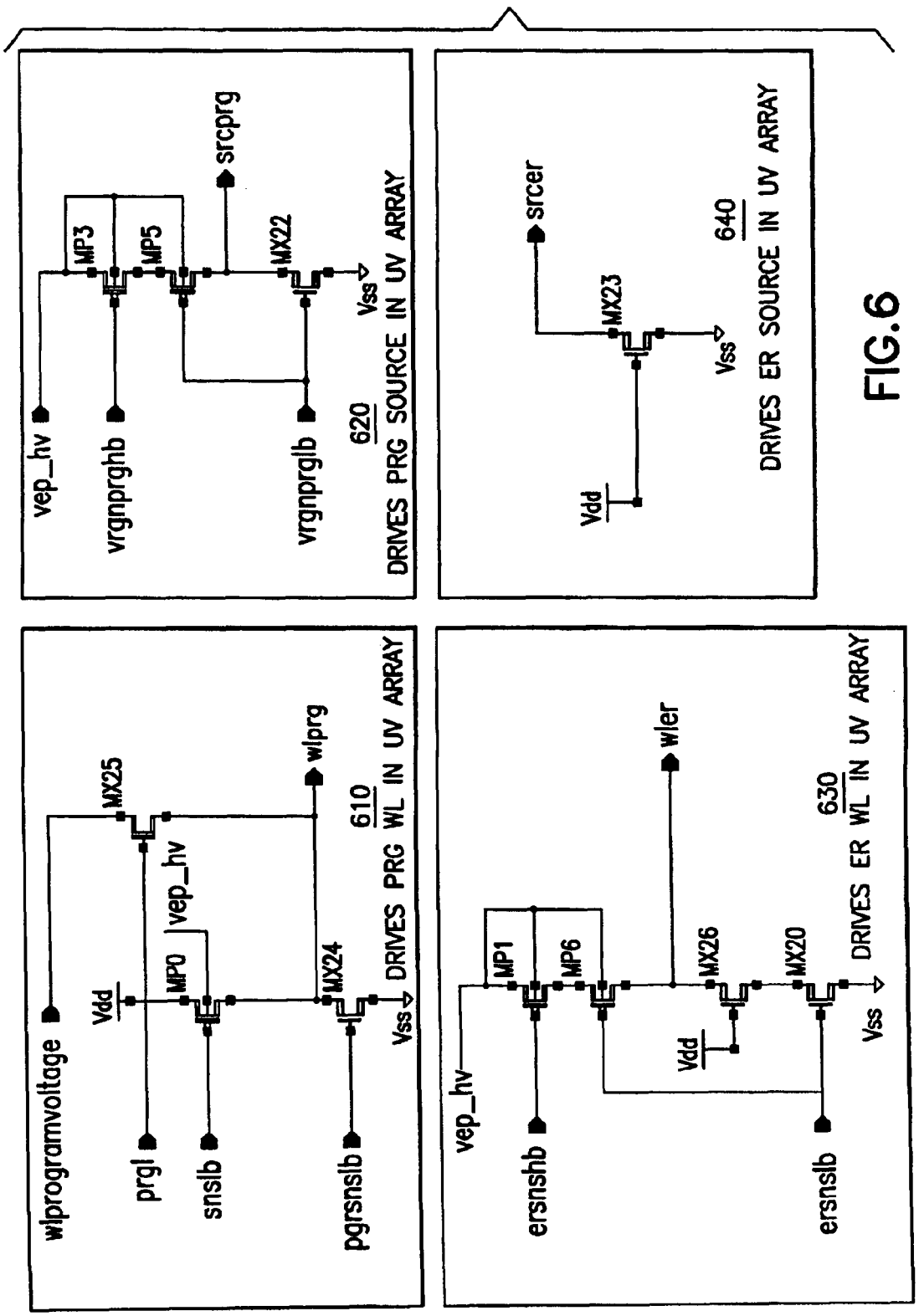
FIG. 6 is a set of circuit diagrams of exemplary word line/source line drivers of FIG. 2.

FIG. 6 is a set of circuit diagrams of exemplary UV control and word line/source line drivers 600 incorporating features of the present invention. As shown in FIG. 6, the word line/source line drivers 600 includes a program word line driver 610, a program source line driver 620, an erase word line driver 630 and an erase source line driver 640.

The drivers provide the appropriate conditions to the indicated terminals associated with the word and source lines during the program and erase modes. For one particular technology, the voltages are as follows:

| Mode | Source Condition (Source Line) | Gate Condition (Word Line) | Drain Condition (Bit Line) |
| --- | --- | --- | --- |
| Read (Sense) | 0 V | 2.5 V | 1.0 V |
| Program | 10 V | 1.5 V | −2 µA, 1.0 V |
| Erase | 0 V | 12 V | 0 V |

It is again noted that the drain terminal of each transistor is accessed via the bit line inputs, blprg and bler, the gate terminal is accessed via the word line inputs, wlprg and wler, and the source terminal is accessed via the source line inputs, srcprg and srcer, respectively. Thus, the driver 610 will pass 1.5V to the word line during a program mode, the driver 620 will pass 10V to the source line during a program mode, the driver 630 will pass 12V to the word line during an erase mode and the driver 640 will bring the source line to ground in an erase mode.

Figure 7:
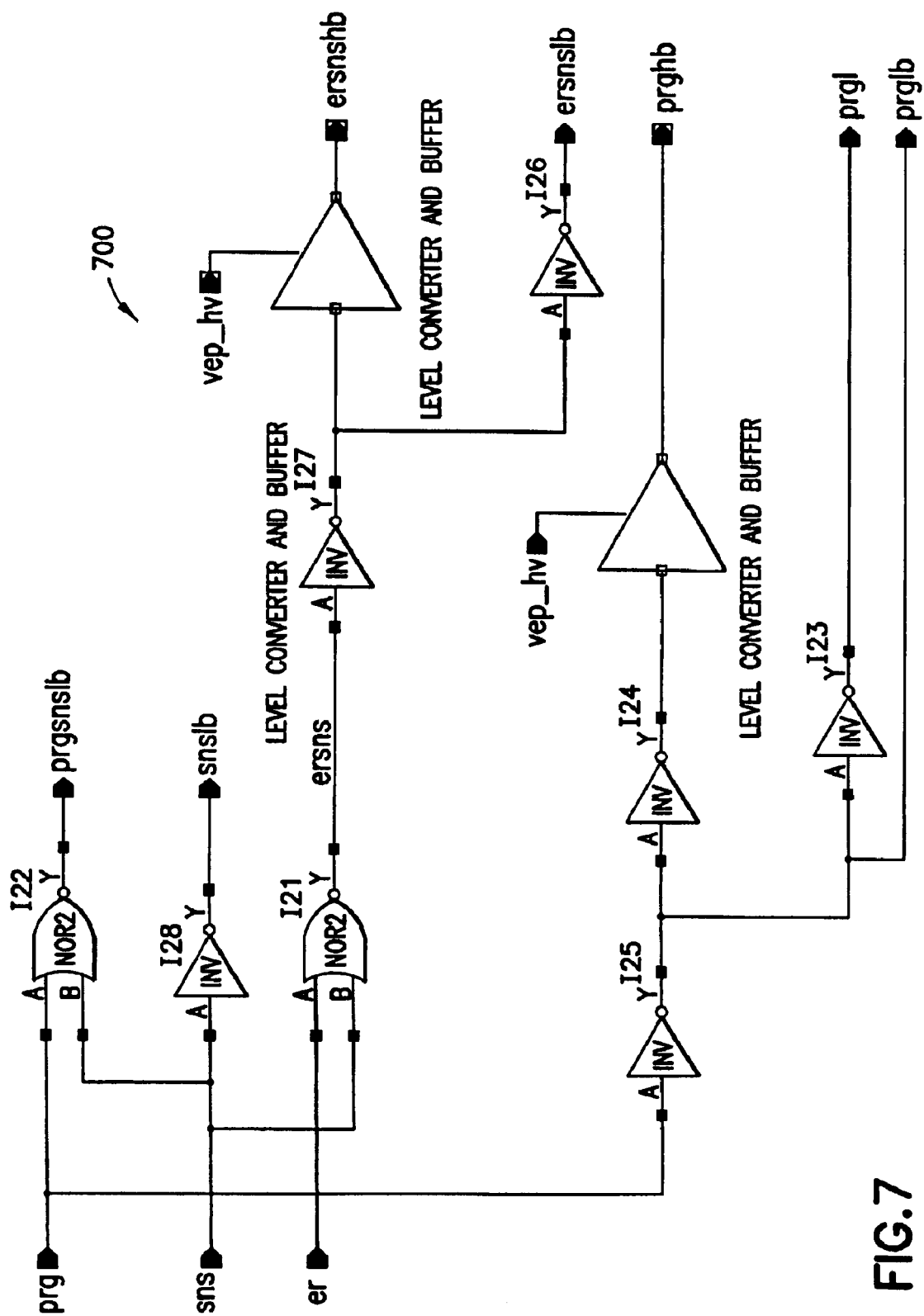
FIG. 7 is a circuit diagram of an exemplary control signal generator of FIG. 1.

FIG. 7 is a circuit diagram of an exemplary control signal generator 700 incorporating features of the present invention. As shown in FIG. 2, the control signals generated by the control signal generator 700 are supplied to the word line/source line driver 600. As shown in FIG. 7, the control signal generator 700 receives a logical value indicating whether the non-volatile memory is in a program, sense or erase mode, and generates the appropriate output signal(s) that are applied to the word line/source line driver 600. The word line/source line drivers 600 of FIG. 6 use the generated signals to provide the appropriate conditions to the transistor terminals associated with the word and source lines during the program and erase modes.

For one exemplary transistor technology, the neutral state of each transistor 310, 320 in the non-volatile memory array 300 can draw 50 µA of current. In addition, the offset current can be set, for example, to 45 µA. Before a semiconductor circuit 100 is exposed to ultra-violet light, the program transistor 310 may draw 10 µA and the erase transistor 320 may draw 100 µA. After the semiconductor circuit has been exposed to ultra-violet light, the program transistor 310 may draw 30 µA and the erase transistor 320 may draw 60 µA. This change in current difference can be detected by the ultra-violet light detection circuit 200 in accordance with the present invention to detect the UV exposure and security violation.

It is to be understood that the embodiments and variations shown and described herein are merely illustrative of the principles of this invention and that various modifications may be implemented by those skilled in the art without departing from the scope and spirit of the invention.

What is claimed is:

1. A semiconductor circuit, comprising:
   a processor for executing one or more instructions;
   a memory; and
   a circuit for detecting whether said semiconductor circuit is exposed to ultra-violet light, said circuit comprising a mini-array of non-volatile memory cells dedicated to detecting whether said semiconductor circuit is exposed to ultra-violet light.

2. The semiconductor circuit of claim 1, wherein said circuit initiates a clearing of said memory of said semiconductor circuit in response to said detection of said exposure to ultra-violet light.

3. The semiconductor circuit of claim 1, wherein said circuit initiates a disabling of said semiconductor circuit in response to said detection of said exposure to ultra-violet light.

4. The semiconductor circuit of claim 1, wherein said circuit uses a state of the non-volatile memory cells to detect whether said semiconductor circuit is exposed to ultra-violet light.

5. A semiconductor circuit comprising:
   a processor for executing one or more instructions;
   a memory; and
   a circuit for detecting whether said semiconductor circuit is exposed to ultra-violet light, said circuit comprises a dedicated mini-array of non-volatile memory cells,
   wherein said dedicated mini-array of non-volatile memory cells includes at least two active bit lines, corresponding to program and erase, and wherein said first bit line, is only programmable and said second bit line, is only erasable.

6. The semiconductor circuit of claim 5, wherein said cells in said dedicated mini-array of non-volatile memory are initially in approximately a same state and wherein said exposed state is detected by sensing said at least two active bit lines.

7. The semiconductor circuit of claim 5, wherein an offset current is added to one of said at least two active bit lines, to detect when said semiconductor circuit is exposed to ultra-violet light.

8. The semiconductor circuit of claim 1, wherein said memory is a non-volatile memory array.

9. The semiconductor circuit of claim 5, wherein cells in said dedicated mini-array of non-volatile memory are in a neutral state when said semiconductor circuit is unexposed and wherein an exposed state of said semiconductor circuit is detected by evaluating a current generated by said cells.

10. The semiconductor circuit of claim 1, further comprising a plurality of other circuits for detecting whether said semiconductor circuit is exposed to ultra-violet light.

11. A semiconductor circuit comprising:
    a processor for executing one or more instructions:
    a memory; and
    a circuit for detecting whether said semiconductor circuit is exposed to ultra-violet light, said circuit comprises a dedicated mini-array of non-volatile memory cells,
    wherein said circuit for detecting whether said semiconductor circuit is exposed to ultra-violet light can detect a previous exposure to ultra-violet light that occurred without power being applied to said semiconductor circuit.

12. A method for detecting a security violation in a semiconductor circuit, said method comprising the steps of:
    employing an array of dedicated non-volatile memory cells to detect whether said semiconductor circuit is exposed to ultra-violet light; and
    initiating a security procedure if said semiconductor circuit is exposed to ultra-violet light.

13. The method of claim 12, wherein said security procedure clears a memory of said semiconductor circuit in response to said detection of said exposure to ultra-violet light.

14. The method of claim 12, wherein said security procedure initiates a disabling of said semiconductor circuit in response to said detection of said exposure to ultra-violet light.

15. The method of claim 12, wherein said employing step further comprises the step of evaluating a circuit indicating whether said semiconductor circuit is exposed to ultra-violet light.

16. The method of claim 12, wherein said array of non-volatile memory cells is embedded on said semiconductor circuit.

17. The method of claim 12, further comprising the step of evaluating a plurality of other circuits for detecting whether said semiconductor circuit is exposed to ultra-violet light.

18. A method for detecting a security violation in a semiconductor circuit, said method comprising the steps of:
    employing an array of non-volatile memory cells to detect whether said semiconductor circuit is exposed to ultra-violet light;
    initiating a security procedure if said semiconductor circuit is exposed to ultra-violet light; and
    detecting a previous exposure to ultra-violet light that occurred without power being applied to said semiconductor circuit.

* * * * *